(12) United States Patent
Tao et al.

(10) Patent No.: US 9,773,853 B2
(45) Date of Patent: Sep. 26, 2017

(54) ORGANIC LIGHT-EMITTING DIODE DISPLAY WITH BENT SUBSTRATE

(71) Applicant: Apple Inc., Cupertino, CA (US)

(72) Inventors: Yi Tao, San Jose, CA (US); Zhen Zhang, San Jose, CA (US); MinKyu Kim, Cupertino, CA (US); Jae Won Choi, Cupertino, CA (US); Young Bae Park, San Jose, CA (US); Joshua G. Wurzel, Sunnyvale, CA (US); Paul S. Drzaic, Morgan Hill, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 22 days.

(21) Appl. No.: 14/860,546

(22) Filed: Sep. 21, 2015

(65) Prior Publication Data
US 2016/0204183 A1    Jul. 14, 2016

Related U.S. Application Data

(60) Provisional application No. 62/101,531, filed on Jan. 9, 2015.

(51) Int. Cl.
*H01L 27/32* (2006.01)
*H01L 51/00* (2006.01)
(Continued)

(52) U.S. Cl.
CPC ........ *H01L 27/3276* (2013.01); *H01L 25/167* (2013.01); *H01L 27/3246* (2013.01);
(Continued)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS 8,592,832 B2    11/2013    Yang et al.
9,104,076 B2 *   8/2015    Son ....................... G02F 1/1345
(Continued)

FOREIGN PATENT DOCUMENTS

CN    103782258    5/2014
CN    104183620    12/2014
(Continued)

*Primary Examiner* — Quoc Hoang
(74) *Attorney, Agent, or Firm* — Treyz Law Group, P.C.; G. Victor Treyz; Zachary D. Hadd

(57) ABSTRACT

A display may have an array of organic light-emitting diodes that form an active area on a flexible substrate. Metal traces may extend between the active area and an inactive area of the flexible substrate. Display driver circuitry such as a display driver integrated circuit may be attached to a flexible printed circuit that is attached to the flexible substrate in the inactive area. The metal traces may extend across a bend region in the flexible substrate. The flexible substrate may be bent in the bend region. The flexible substrate may be locally thinned in the bend region. A neutral stress plane adjustment layer may cover the metal traces in the bend region. The neutral stress plane adjustment layer may include polymer layers such as an encapsulation layer, a pixel definition layer, a planarization layer, and a layer that covers a pixel definition layer and planarization layer.

13 Claims, 17 Drawing Sheets

(51) Int. Cl.
  *H01L 25/16* (2006.01)
  *H01L 51/52* (2006.01)
  *H01L 51/56* (2006.01)
(52) U.S. Cl.
  CPC ...... *H01L 27/3258* (2013.01); *H01L 27/3297* (2013.01); *H01L 51/0097* (2013.01); *H01L 51/5253* (2013.01); *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 9,209,207 | B2 | 12/2015 | Park et al. |
| 9,516,743 | B2 * | 12/2016 | Kim ................ H05K 1/028 |
| 2002/0149572 | A1 | 10/2002 | Schulz et al. |
| 2011/0012845 | A1 | 1/2011 | Rothkopf et al. |
| 2014/0042406 | A1 | 2/2014 | Degner et al. |
| 2014/0055702 | A1 | 2/2014 | Park et al. |
| 2014/0183473 | A1 | 7/2014 | Lee et al. |
| 2014/0183743 | A1 | 7/2014 | Matsumoto et al. |
| 2014/0240985 | A1 | 8/2014 | Kim et al. |
| 2014/0299884 | A1 | 10/2014 | Park et al. |
| 2014/0306941 | A1 * | 10/2014 | Kim ................ H04M 1/0268 345/204 |
| 2015/0004375 | A1 | 1/2015 | Hou et al. |
| 2015/0069341 | A1 | 3/2015 | Kim et al. |
| 2015/0207102 | A1 * | 7/2015 | Jeong ................ H04M 1/0268 257/40 |

FOREIGN PATENT DOCUMENTS

| | | |
|---|---|---|
| EP | 2259321 | 12/2010 |
| TW | 201448691 | 12/2014 |
| WO | 2013036675 | 3/2013 |
| WO | 2014168747 | 10/2014 |

* cited by examiner

ORGANIC LIGHT-EMITTING DIODE DISPLAY WITH BENT SUBSTRATE

This application claims the benefit of provisional patent application No. 62/101,531 filed on Jan. 9, 2015, which is hereby incorporated by reference herein in its entirety.

BACKGROUND

This relates generally to electronic devices with displays, and, more particularly, to displays with bent portions.

Electronic devices often include displays. Displays such as organic light-emitting diode displays may be formed on flexible substrates. Displays with flexible substrates may be bent. For example, it may be desirable to bend an edge of a display to hide inactive display components along the edge of the display from view.

The process of bending a display can create stresses within the structures of the display. For example, bent metal traces may become stressed. Stress-induced damage such as cracks may adversely affect display reliability.

It would therefore be desirable to be able to provide improved displays with bent portions.

SUMMARY

A display may have an array of organic light-emitting diodes that form an active area on a flexible substrate. Metal traces may form signal lines for the display. The metal traces may extend between the active area and an inactive area of the flexible substrate. Display driver circuitry such as a display driver integrated circuit may be attached to a flexible printed circuit that is attached to the flexible substrate in the inactive area.

The metal traces may extend across a bend region in the flexible substrate. The flexible substrate may be bent about a bend axis in the bend region. For example, the flexible substrate may be bent to hide the inactive area of the display from view.

The flexible substrate may be locally thinned in the bend region. The flexible substrate may, for example, be locally etched. If desired, the flexible substrate may be formed by depositing and curing liquid polymer on a temporary substrate that has raised portions that form a template.

A neutral stress plane adjustment layer may cover the metal traces in the bend region and may be used to ensure that a neutral stress plane is aligned with the metal traces. This helps minimize stress in the metal traces. The neutral stress plane adjustment layer may include polymer layers such as an encapsulation layer, a pixel definition layer, a planarization layer, and an optional layer that covers the pixel definition layer and the planarization layer.

DETAILED DESCRIPTION

Figure 1:
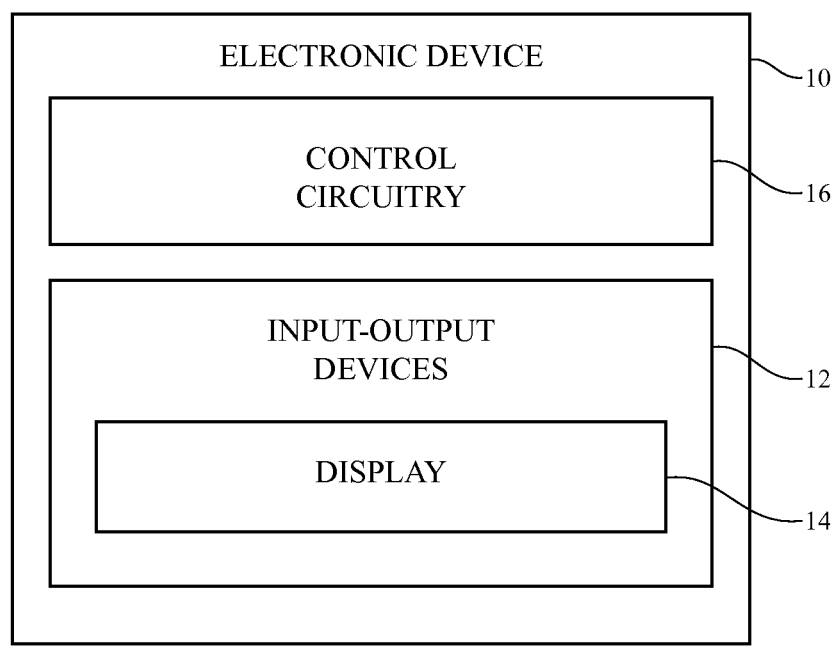
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display, a display formed from inorganic light-emitting diodes, a liquid crystal display, an electrophoretic display, or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
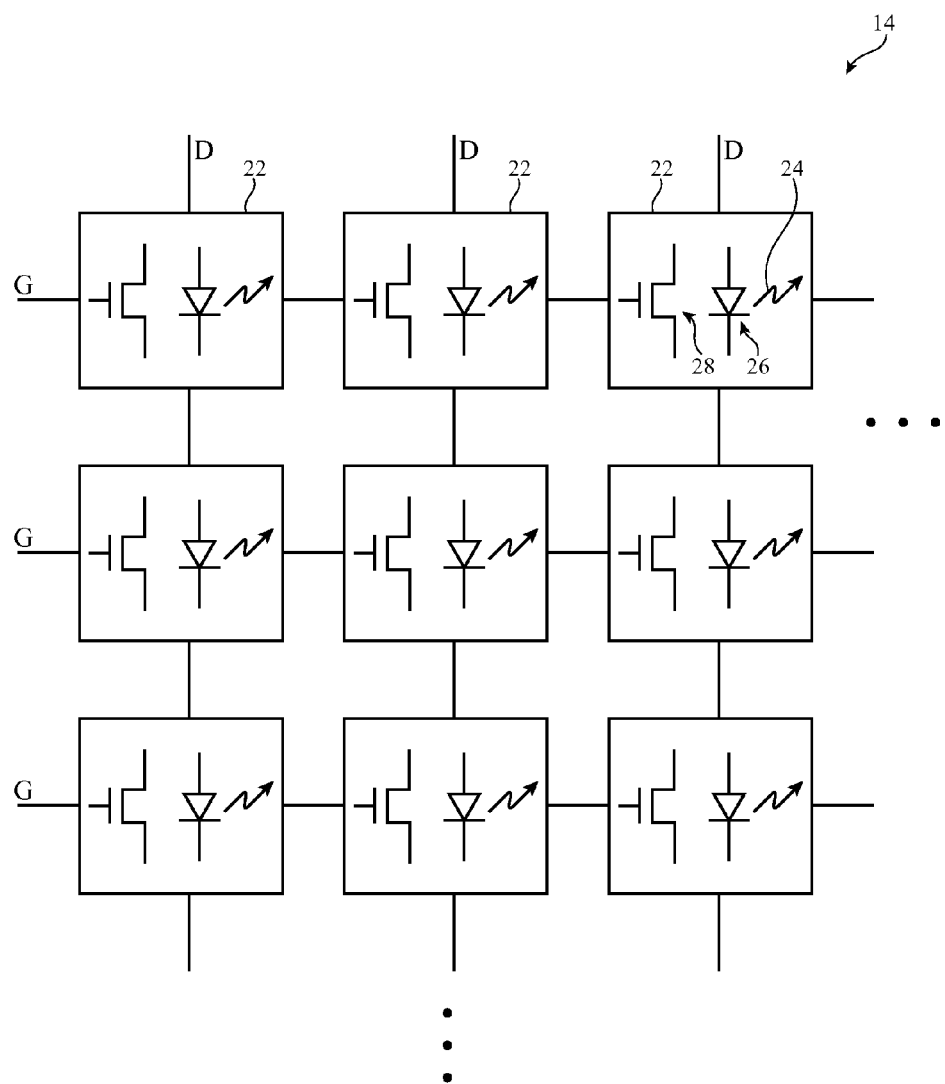
FIG. 2 is a top view of an illustrative display in an electronic device in accordance with an embodiment.

A top view of a portion of display 14 is shown in FIG. 2. As shown in FIG. 2, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, thin-film transistors formed from organic semiconductors such as those having a polythiophene backbone, or thin-film transistors formed from other semiconductors.

Figure 3:
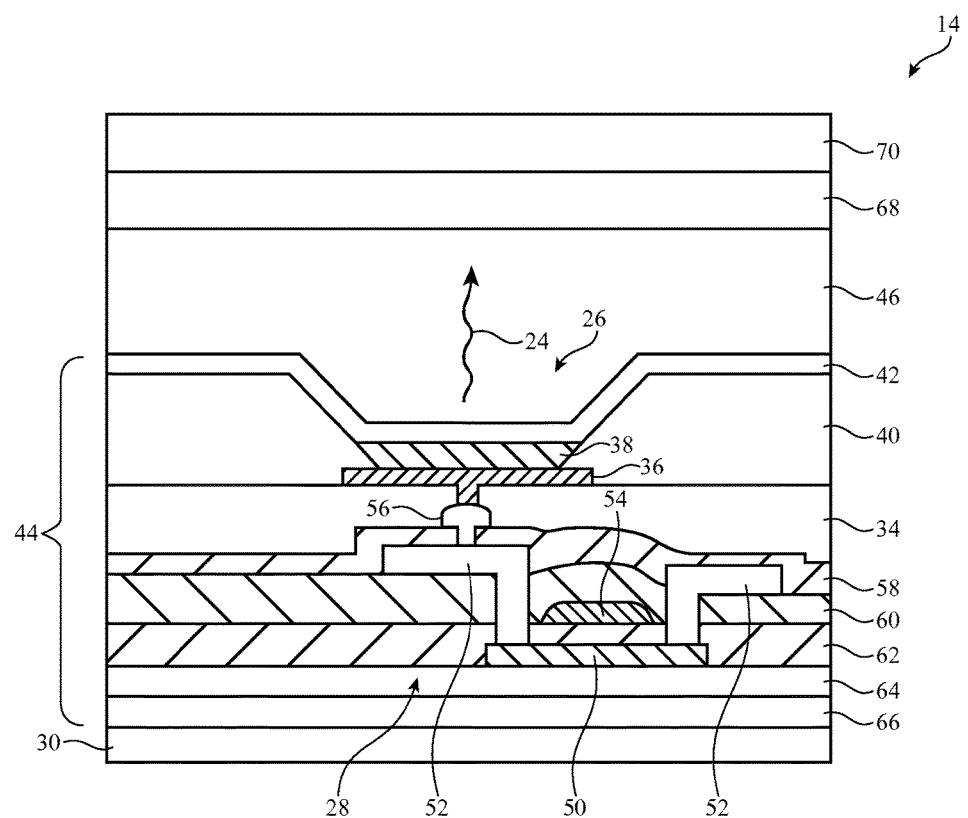
FIG. 3 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 3. As shown in FIG. 3, display 14 may include a substrate layer such as substrate layer 30. Substrate 30 may be formed from plastic or other suitable materials. Configurations for display 14 in which substrate 30 has been formed from a material such as flexible polyimide or other polymer materials are sometimes described herein as an example.

Thin-film transistor circuitry 44 may be formed on substrate 30. Thin film transistor circuitry 44 may include anode structures such as anode 36. Anode 36 may be formed from a layer of conductive material such as metal on the surface of planarization layer 34. Planarization layer 34 may be formed from an organic material such as polyacrylate, polyimide, or other polymer, may be formed from inorganic dielectric materials such as spin-on glasses, or other dielectric materials (as an example). Layer 34 may help planarize underlying thin-film transistor structures in circuitry 44. These structures may include semiconductor layers, metal layers, and dielectric layers that form circuitry 44. Circuitry 44 may include transistors such as transistors 28 of FIG. 2 and capacitors for controlling light-emitting diodes such as light emitting diode 26 of FIG. 3. During operation, light-emitting diode 26 may emit light 24.

Light-emitting diode 26 may be formed within an opening in pixel definition layer 40. Pixel definition layer 40 may be formed from a patterned photoimageable polymer such as polyimide. In each light-emitting diode, organic emissive material 38 is interposed between a respective anode 36 and cathode 42. Anodes 36 may be patterned from a layer of metal on layer 34. Cathode 42 may be formed from a common conductive layer that is deposited on top of pixel definition layer 40. Cathode 42 is transparent so that light 24 may exit light emitting diode 26.

Thin-film transistor circuitry 44 may include transistors such as transistor 28 that are formed from patterned semiconductor channel regions such as semiconductor channel 50. Source-drain contacts 52 may be coupled to opposing ends of semiconductor 50. Semiconductor 50 may be polysilicon, a semiconducting oxide, an organic semiconductor, or other semiconductor. Metal layers in circuitry 44 may be patterned to form transistor gates such as transistor gate 54. Each transistor may have one or more gates and the gate structures may be located above and/or below the semiconductor region of the transistor. In the example of FIG. 3, transistor 28 has a single gate (gate 54) located above semiconductor layer 50.

Metal interconnect structures may be used to interconnect transistor 28 with other components in circuitry 44. As shown in FIG. 3, for example, via 56 may be used to couple one of source-drain contacts 52 of transistor 28 to anode 36. Metal interconnect lines may also be used to route signals to capacitors, to gate 54 and other transistor structures, to data lines D and gate lines G, to contact pads (e.g., contact pads coupled to gate driver circuitry), and to other circuitry in display 14. These metal interconnect lines may be formed from the same metal layers as metal 56, the same metal layers as gate 54, the same metal layers as source-drain electrodes 52, and/or other metal layers in thin-film transistor circuitry 44.

Dielectric materials may be used to separate conductive structures in thin-film transistor circuitry 44. As shown in FIG. 3, dielectric buffer layers such as buffer layers 66 and 64 may be formed on the surface of substrate 30. Buffer layer 66 may be formed from inorganic thin-films such as a stack of alternating silicon oxide and silicon nitride layers and buffer layer 64 may be formed from silicon oxide (as examples). Gate insulator layer 62 may be formed from an inorganic dielectric such as silicon oxide and may separate gate 54 from semiconductor layer 50. One or more interlayer dielectric layers such as layer 60 may be formed on gate insulator layer 62 and may cover transistor structures such as gate 54. Interlayer dielectric 60 may be formed from a layer of silicon oxide covered with a layer of silicon nitride and/or may be formed from other inorganic dielectric materials. Dielectric layer 58 may be a passivation layer formed from a layer of silicon oxide covered with a layer of silicon nitride and/or other inorganic dielectric materials. Planarization layer 34 and pixel definition layer 40 may be formed on passivation layer 58.

If desired, display 14 may have a protective outer display layer such as cover glass layer 70. The outer display layer may be formed from a material such as sapphire, glass, plastic, clear ceramic, or other transparent material. Protective layer 46 may cover cathode 42. Functional layers 68 may be interposed between layer 46 and cover layer 70. Functional layers 68 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as protective layer 46, thin-film transistor circuitry 44, and substrate 30.

Display 14 may have an active area in which pixels 22 form images for viewing by a user of device 10. The active area may have a rectangular shape. Inactive portions of display 14 may surround the active area. For example, signal traces and other support circuitry such as thin-film display driver circuitry may be formed along one or more of the four edges of display 14 that run around the rectangular periphery of display 14 adjacent to the active area. If desired, one or more display driver integrated circuits may be mounted to substrate 30 in the inactive border. For example, a flexible printed circuit on which one or more display driver integrated circuits have been mounted using solder may be attached to the border of display 14. This type of configuration is sometimes referred to as a chip-on-flex configuration and allows display driver circuitry to supply signals to the data and gate lines on display 14.

To minimize the amount of the inactive border area of display 14 that is visible to a user, one or more edges of display 14 may be bent. As an example, the edge of display 14 to which a display driver circuit is mounted using a chip-on-flex arrangement may be folded under the active area of display 14. This helps minimize visible display borders and reduces the footprint of display 14.

Figure 4:
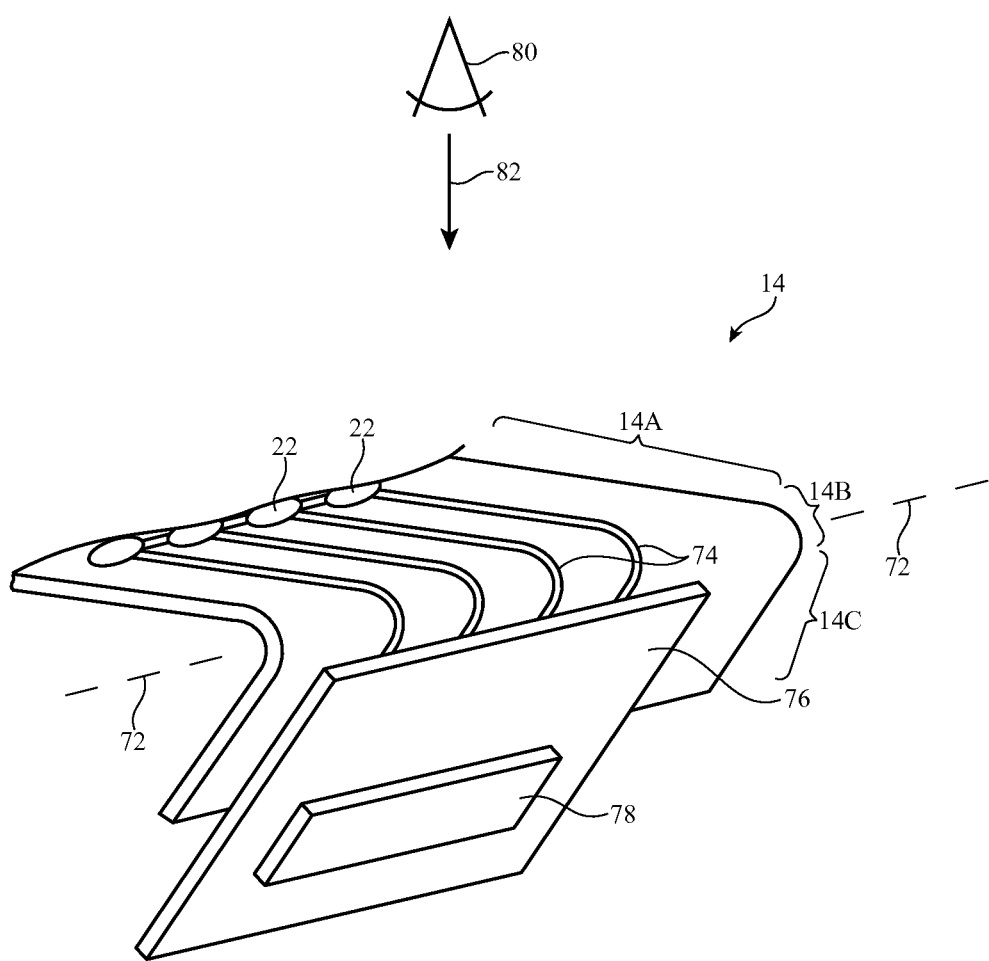
FIG. 4 is perspective view of an illustrative display with a bent portion in accordance with an embodiment.
Figure 5:
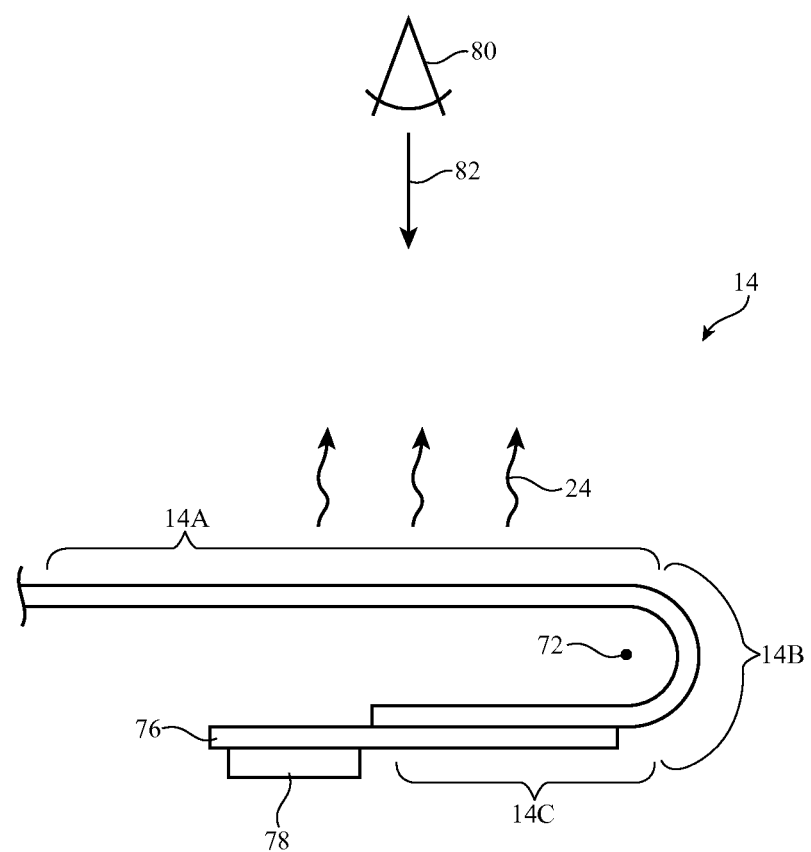
FIG. 5 is a cross-sectional side view of an illustrative display with a bent portion in accordance with an embodiment.

An illustrative display with a bent edge portion is shown in FIG. 4. As shown in FIG. 4, display 14 has portion 14A (i.e., a planar active area portion that contains the active area of display 14 that is formed by an array of pixels 22), bent portion 14B, and chip-on-flex portion 14C (i.e., an inactive display substrate portion to which flexible printed circuit 76 has been used to mount display driver integrated circuit 78 to display 14). If desired, connectors, additional integrated circuits, and/or other components may be mounted on flexible printed circuit 76. Metal traces 74 may carry signals between flexible printed circuit 76 and pixels 22 (i.e., metal traces 74 may traverse bent portion 14B of display 14). As shown in the example of FIG. 4, when bent portion 14B is bent around bend axis 72, portion 14C is folded under portion 14A and is therefore hidden from view by a user such as viewer 80 who is viewing display 14 in direction 82. FIG. 5 is a cross-sectional side view of a display of the type shown in FIG. 4 in which inactive edge portion 14C of display 14 has been bent further underneath active display portion 14A by bending display 14 about bend axis 72 in bend region 14B.

Stresses can be imparted to display structures in a flexible display when the display is bent. For example, metal traces such as metal traces 74 of FIG. 4 that are used to form signal lines that convey signals between display driver circuitry 78 and pixels 22 may be subjected to bending stresses in bend region 14B. To minimize bending stress and thereby minimize cracks in metal traces 74, it may be desirable to align the neutral stress plane of display 14 in bend region 14B with metal traces 74.

Figure 6:
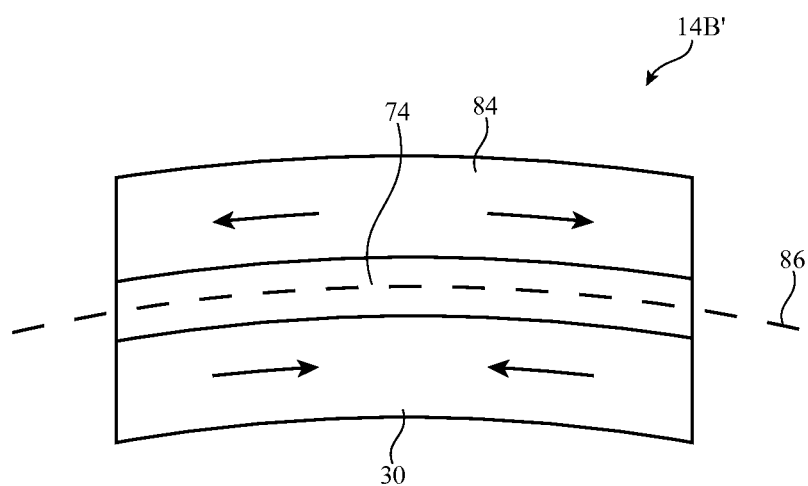
FIG. 6 is a cross-sectional side view of an illustrative bent substrate showing how a neutral stress plane may be aligned with metal traces on the substrate using a neutral stress plane adjustment layer in accordance with an embodiment.

As shown in FIG. 6, when a portion of display 14 is bent in region 14B, some layers such as substrate 30 may be subjected to compressive stress and some layers such as coating layer 84 may be subjected to tensile stress. Neutral stress plane 86 arises where stress has been eliminated by balancing the compressive stress and tensile stress. The shape of neutral stress plane 86 may be curved in a curved portion of display 14 such as portion 14B' of FIG. 6 (i.e., neutral stress plane 86 may have a curved profile).

The relative thicknesses of substrate 30 and coating 84 and the relative modulus of elasticity values for substrate 30 and coating 84 determine the location of the neutral stress plane within the layers of bent display region 14B. For example, if the modulus of elasticity of substrate 30 and coating 84 is the same, neutral stress plane 86 can be aligned with metal traces 74 by ensuring that coating 84 has the same thickness as substrate 30. If, on the other hand, coating 84 has a modulus of elasticity that is larger than that of substrate 30, coating 84 need not be as thick as substrate 30 to balance the compressive and tensile stresses. Because the thickness of coating 84 can be selected so that neutral stress plane 86 is aligned with metal traces 74, layer 84 may sometimes be referred to as a neutral stress plane adjustment layer. Layer 84 may be formed from one or more polymer layers or other layers of material (e.g., organic layer(s), inorganic layer(s), and/or combinations of organic and inorganic layers).

To facilitate bending and reduce the thickness needed for layer 84, it may be desirable to thin some or all of substrate 30. For example, substrate 30 may have a thickness of less than 16 microns, less than 12 microns, 8 microns, 6-10 microns, more than 4 microns, or 4-15 microns (as examples). The thin portion of substrate 30 may extend across the entire surface of display 14 or may be localized. For example, substrate 30 may be locally thinned in bend region 14B (i.e., substrate 30 may be thinner in region 14B than in region 14A and/or region 14C). In configurations in which substrate 30 has been thinned, the thickness of layer 84 may be reduced while ensuring that neutral stress plane 86 is aligned with metal traces 74.

Figure 7:
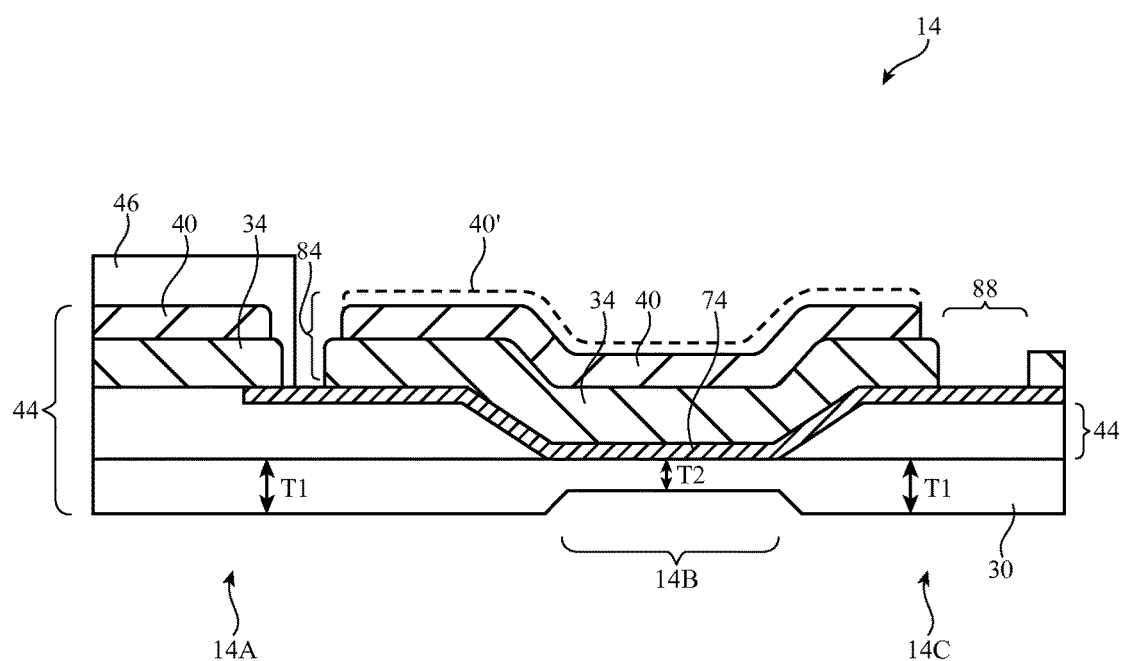
FIG. 7 is a cross-sectional side view of an illustrative display having a flexible substrate with a locally thinned portion and a neutral stress plane adjustment layer in accordance with an embodiment.

Consider, as an example, display 14 of FIG. 7. As shown in FIG. 7, display 14 may have main region 14A, bend region 14B, and pad region 14C. Substrate 30 may have a first thickness T1 in regions 14A and 14C and a second thickness T2 that is less than T1 in region 14B. Substrate 30 may be thinned by removing material from its upper surface, by removing material from its lower surface (as shown in FIG. 7), or by removing material from both its upper and lower surfaces.

In region 14A, thin-film transistor circuitry 44 is encapsulated using protective layer 46. Metal traces 74 extend from region 14A to region 14C through bend region 14B (which has not yet been bent in the configuration of FIG. 7). In region 14C, portions of metal traces 74 may be exposed to form pads such as pad 88 (e.g., openings may be formed in overlapping layers such as planarization layer 34 and pixel definition layer 40). In region 14B, the thickness of layer 84 may be configured to align neutral stress plane 86 with traces 74.

To avoid the need to deposit additional layers on display 14, it may be desirable to form some or all of layer 84 from layers of material that would otherwise already be present in display 14. As shown in FIG. 7, for example, planarization layer 34 and pixel definition layer 40 may be formed in region 14B and may serve as neutral stress plane adjustment layer 84. If desired, planarization layer 34 may be used to form neutral stress plane adjustment layer 84 without using pixel definition layer 40 or pixel definition layer 40 may be used to form neutral stress plane adjustment layer 84 without using planarization layer 34. Neutral stress plane adjustment layer 84 may also be formed from one or more additional layers such as layer 40'. Layer 40' may be a polymer encapsulation layer and/or inorganic encapsulation layer or multiple polymer and/or inorganic encapsulation layers of the type that may sometimes be used to form all or part of an encapsulation layer stack (inorganic/organic/inorganic, etc.) in encapsulation layer 46 or may be one or more separate organic and/or inorganic layers. Layers such as layer 40' may have a thickness of 10-20 microns, more than 5 microns, less than 40 microns, or other suitable thickness. Examples of polymers that may be used in forming layer 40' include polyimide and other polymeric materials. Layer 40' (e.g., one or more polymer layers in layer 40') may be deposited using screen printing, inkjet printing, or other deposition techniques. The thickness of layer 40' may be selected to help balance the stresses in region 14B and thereby ensure satisfactory alignment of neutral stress plane 86 with traces 74. The deposition processes and patterning processes used in forming layer 40' and the other layers of display 14 may be performed while processing a large panel such as a mother glass substrate with high precision. In an illustrative configuration, pixel definition layer 40 and planarization layer 34 many have thicknesses of about three microns each (e.g., 2-4 microns, more than 1 micron, less than 5 microns, etc.). If desired, silicon nitride passivation layer structures may be omitted under pixel definition layer 40 and planarization layer 34 in region 14B (e.g., layers 40 and 34 may serve as passivation). The structures of FIG. 7 may, if desired, be formed while processing large common display substrate structures (i.e., during "motherglass" processing).

Figure 8:
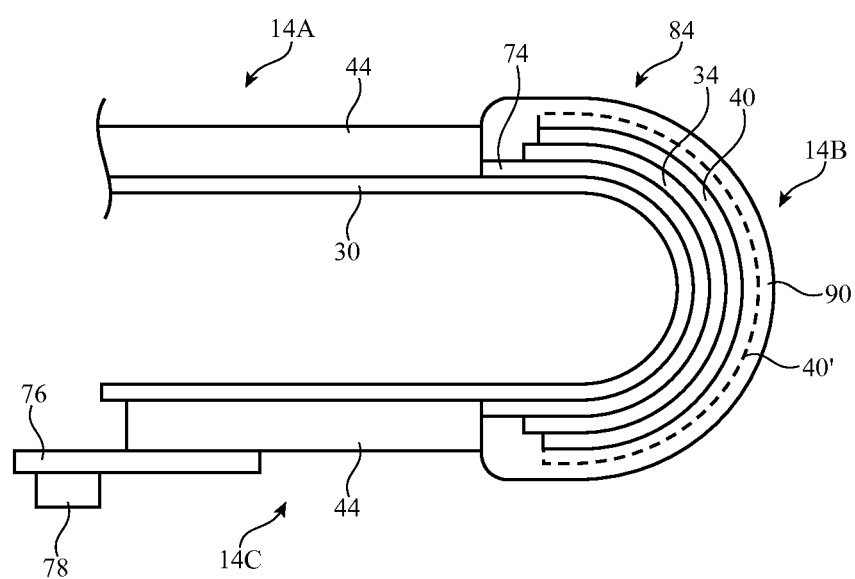
FIG. 8 is a cross-sectional side view of an illustrative display in which a neutral stress plane adjustment layer has been formed from several polymer layers in a bend region of the display in accordance with an embodiment.

As shown in the cross-sectional side view of FIG. 8, an additional layer such as additional coating layer 90 may be incorporated into neutral stress plane adjustment layer 84. Coating layer 90 may be formed from an organic material such as a polymer and may serve as a polymer cover layer. The thickness of coating layer 90 may be 50-90 microns, 60-80 microns, more than 40 microns, less than 100 microns, or other suitable thickness. In configurations in which substrate 30 is sufficiently thin (e.g., 8 microns, less than 16 microns, etc.) and/or in which layers 34 and/or 40 supply sufficient neutral stress plane adjustment, coating layer 90 may be omitted, as described in connection with FIG. 7. If desired, neutral stress plane adjustment layer 84 may be used to adjust to the location of neutral stress plane 86 in configurations in which substrate 30 has not been locally thinned.

Figure 9:
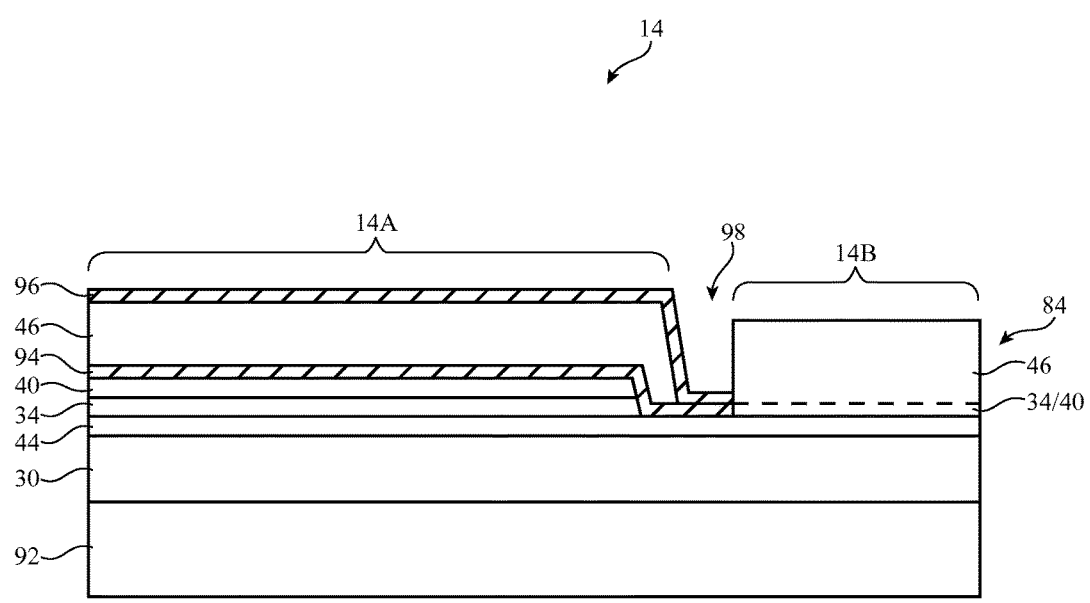
FIG. 9 is a cross-sectional side view of an illustrative display showing how moisture barrier layers may be used to help prevent moisture intrusion into pixels in an active area of the display in accordance with an embodiment.

FIG. 9 is a cross-sectional side view of display 14 showing how encapsulation layer 46 may be used in forming neutral stress plane adjustment layer 84. During processing, substrate 30 may be supported on a temporary substrate such as glass layer 92. As shown in FIG. 9, thin-film transistor circuitry 44 may be formed on the upper surface of substrate 30. Planarization layer 34 may be formed as part of circuitry 44 within region 14A and pixel definition layer 40 may be formed as part of circuitry 44 within region 14A.

Passivation layers such as silicon nitride layer 94 and silicon nitride layer 96 may be formed above and below encapsulation layer 46 to serve as moisture barriers. To ensure that moisture-barrier protection is provided to encapsulant 46 in region 14A, a trench such as trench 98 may be formed between region 14A and region 14B (e.g., around the periphery of the active area of display 14). In trench 98, upper silicon nitride layer 96 contacts lower silicon nitride layer 94. Because layers 96 and 94 are joined within trench 98, moisture is prevented from reaching encapsulation layer 46 and damaging underlying thin-film transistor circuitry 44. In bend region 14B, layer 84 may be formed completely or partly from encapsulation layer 46. If desired, layer 84 may include planarization layer 34 and/or pixel definition layer 40. The processes of FIG. 9 may, if desired, be performed during panel processing operations (e.g., at the motherglass level). Temporary glass support substrate 92 may be removed after display 14 has been formed.

Figure 10:
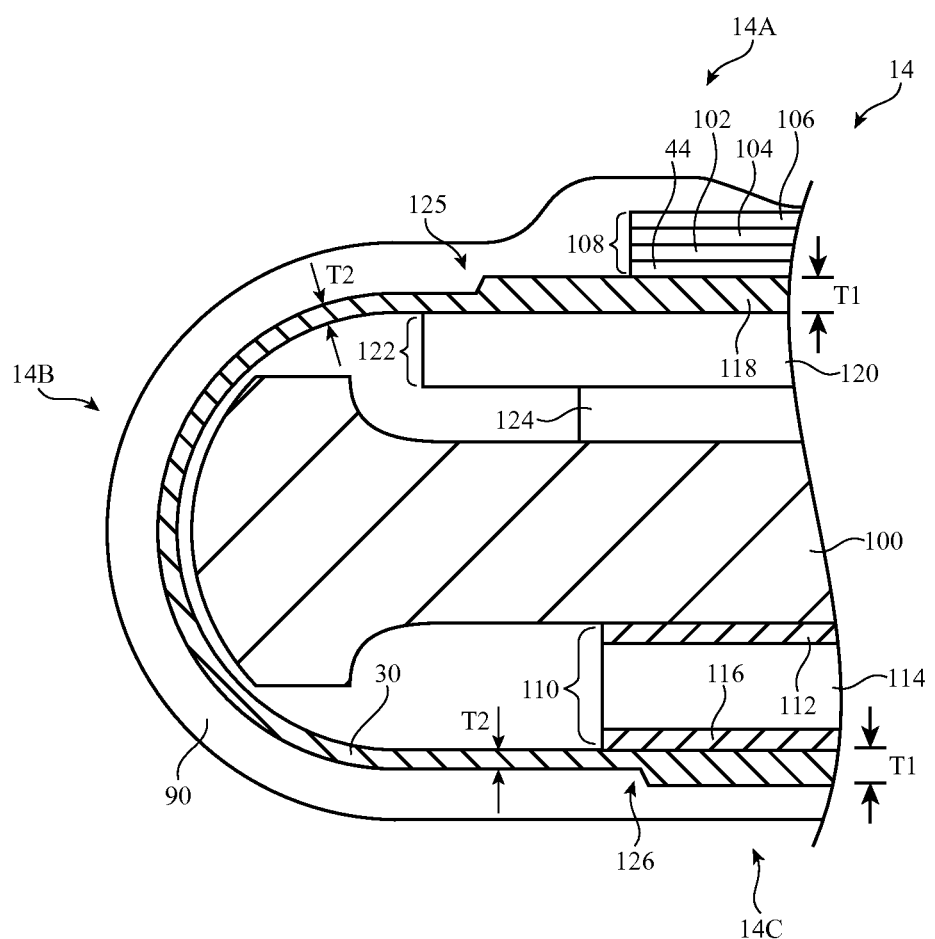
FIG. 10 is a cross-sectional side view of a portion of an illustrative display with a bent flexible substrate having a locally thinned portion that is supported by a mandrel in accordance with an embodiment.

FIG. 10 is a cross-section side view of display 14 in an illustrative configuration in which flexible display layers have been bent around a support structure such as mandrel 100. As shown in FIG. 10, substrate 30 may have a first thickness T1 in regions 14A and 14 C and may have a locally thinned second thickness T2 in bend region 14 B. Structure such as structures 122, 124, and 110 may be used in attaching display 14 to mandrel 100. Structure 124 may be a layer of foam or other layer of material with a low modulus of elasticity that helps provide the mounting arrangement of FIG. 10 with the ability to expand and contract slightly (e.g., so that display 14 may be mounted within a device housing). Structure 122 may include an adhesive layer such as pressure sensitive adhesive layer 118 and a substrate layer such as polymer layer 120. Structure 110 may include pressure sensitive adhesive layer 112, polymer substrate 114, and pressure sensitive adhesive layer 116. Moisture barrier film 108 may cover thin-film transistor circuitry 44 in region 14A. Moisture-barrier film 108 may include polymer substrate 106, an individual inorganic layer, stacked inorganic layers or a combination of stacked organic and inorganic layers 104, and pressure sensitive adhesive layer 102. Inorganic layers 102 may prevent moisture from penetrating to thin-film transistor circuitry 44. Coating layer 90 may form some or all of neutral stress plane adjustment layer 84 in bend region 14B. Layer 90 may be formed from a layer of cured liquid adhesive or other polymer (e.g., a layer of ultraviolet-light-cured adhesive that is 30-50 microns thick, that is more than 20 microns thick, or that is less than 80 microns thick).

Figure 11:
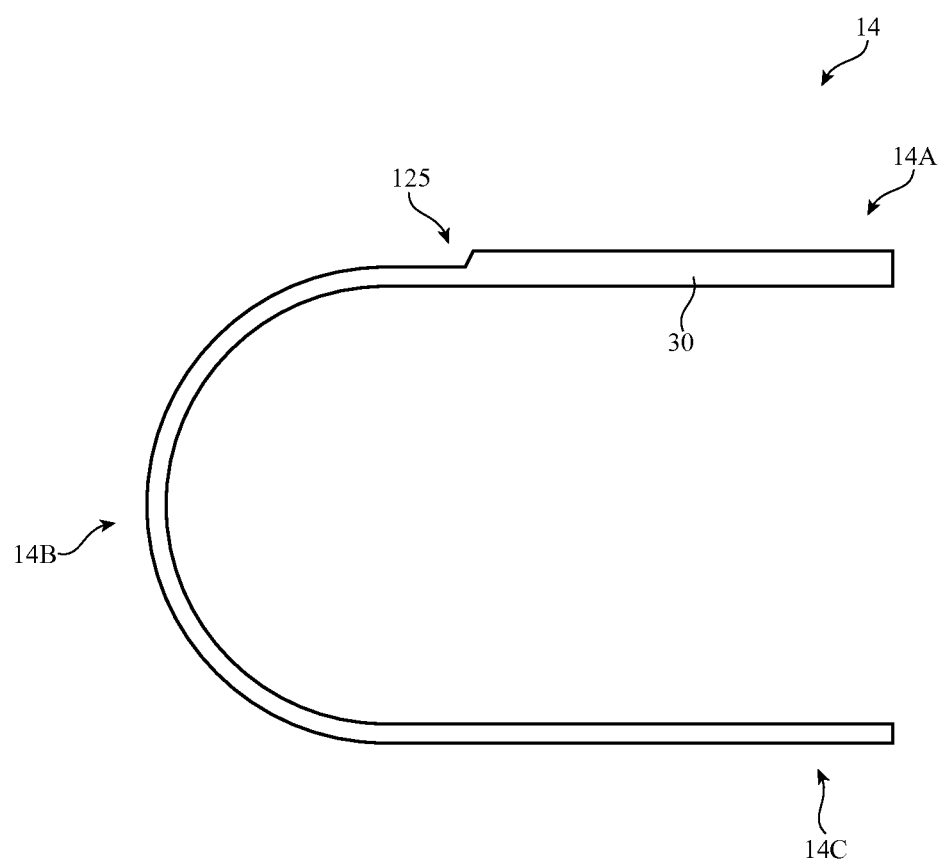
FIG. 11 is a cross-sectional side view of an illustrative flexible substrate with a locally thinned portion in accordance with an embodiment.

In the example of FIG. 10, substrate 30 has two thickness steps. When transitioning between region 14A and region 14B, substrate 30 exhibits a decrease in thickness at step 125. Substrate 30 is locally thinned (with thickness T2) in region 12B. When transitioning between region 14B and region 14C, substrate 30 exhibits an increase in thickness at step 126. To help prevent traces 74 from becoming cracked, it may be desirable to ensure that substrate 30 exhibits smooth changes in thickness at steps such as steps 125 and 126. For example, steps 125 and 126 may be characterized by a step angle of about 45° (e.g., a transition length of about 5-10 microns when the step height is about 8 microns). Step angles (slopes) of 30-60°, less than 65°, or more than 25° may also be used, if desired. As shown in the cross-sectional side view of FIG. 11, substrate 30 may, if desired, have only a single step in height (e.g., step 125).

Figure 12:
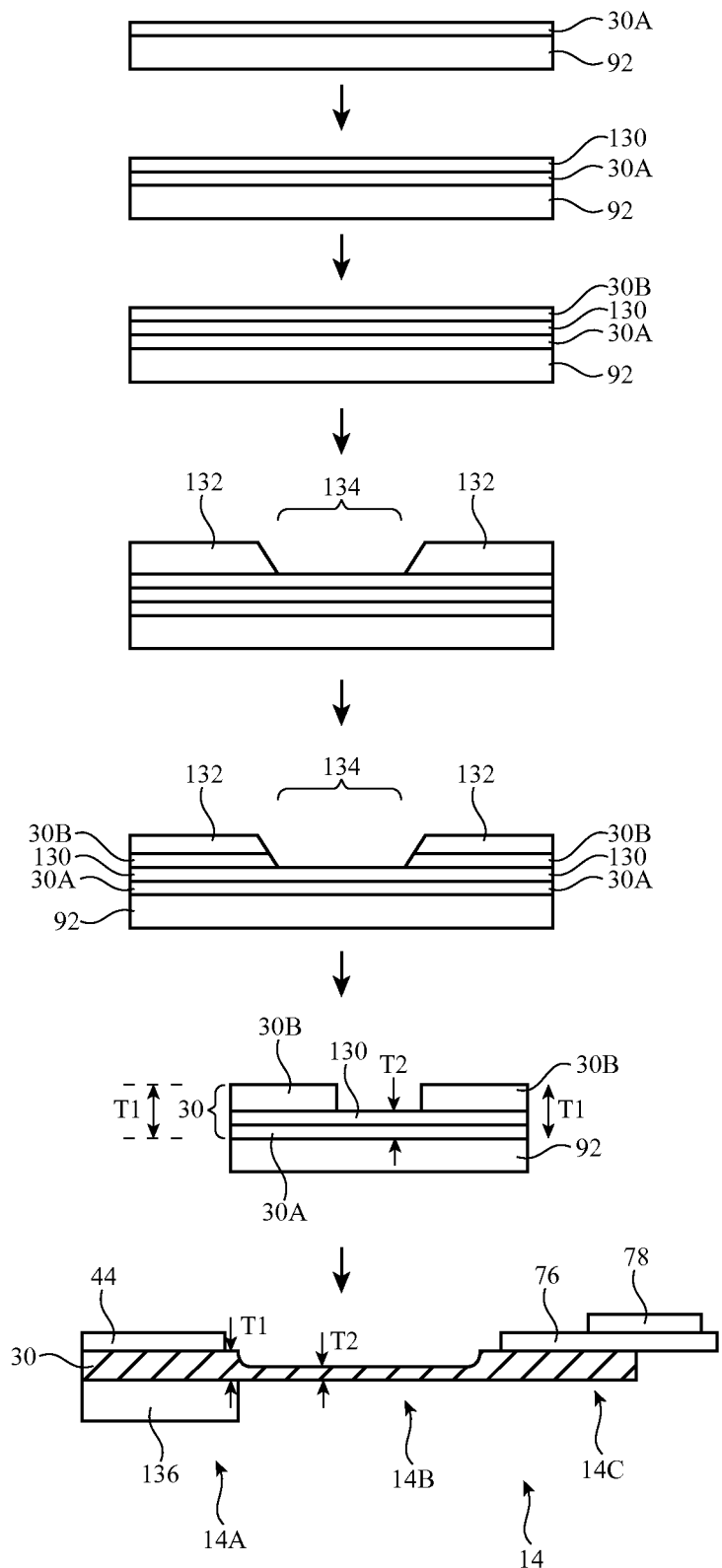
FIG. 12 is a diagram illustrating how a display with a bent region may be formed by locally thinning a flexible substrate using a front-side etch process in accordance with an embodiment.

Locally thinned substrate layers for display 14 may be formed using substrate templates, using etch stop layers, or using other processing arrangements. FIG. 12 shows how an edge stop layer may be used in thinning substrate 30 with a front-side etch arrangement. Initially, polyimide layer 30A is formed on temporary glass substrate 92. Polyimide coating 30A may, for example, be deposited by slit coating a liquid polyimide material onto substrate 92 and curing the deposited liquid using thermal curing techniques or ultraviolet light curing techniques. The thickness of polyimide layer 30A may be, for example, 1-10 microns.

Etch stop layer 130 may then be deposited on top of polyimide layer 30A. Layer 130 may have a thickness of 500 angstroms to 5000 angstroms or other suitable thickness. Layer 130 may be an inorganic material such as silicon oxide, silicon nitride, silicon oxynitride, aluminum oxide, titanium oxide, manganese oxide, hafnium oxide, other metal oxides, or other inorganic materials. Layer 130 may be deposited using chemical vapor deposition or physical vapor deposition (including atomic layer deposition).

After forming polymer layer 30A and etch stop layer 130, a second polyimide coating layer such as coating layer 30B may be formed on top of etch stop layer 130. The thickness of polyimide layer 30B may be, for example, 1-10 microns. Polyimide layer 30B may be formed by slit coating of liquid polyimide followed by thermal or ultraviolet light curing.

A photoresist layer such as photoresist layer 132 may then be deposited and photolithographically patterned to form openings such as opening 134. Following photoresist patterning, a dry etch (e.g., a vacuum etch) may be used to remove the portion of polyimide layer 30B that is exposed within opening 134. During etching, photoresist layer 132 prevents underlying portions of polyimide layer 30B from being etched. In opening 134, polyimide layer 30B is removed by the etching process until etching stops due to the presence of etch stop layer 130.

The dry etch process selectively thins substrate layer 30 so that layer 30 has a thickness T1 where layers 30B and 30A are present and has a smaller thickness T2, where only layer 30A is present. After stripping photoresist 132 from the surface of substrate 30, thin-film transistor circuitry 44 may be formed. Temporary glass substrate 92 may be removed. Optional supporting substrate 136 (e.g., a polymer layer) may be added to substrate 30 in region 14A. Flexible printed circuit 76 may be used to attach display driver integrated circuit 78 in region 14C.

Display 14 may be bent in bend region 14B. Neutral stress plane adjustment layer 84 may be formed on substrate 30 in region 14B to ensure that sensitive display structures such as metal traces 74 and dielectric layers are not damaged during bending.

Figure 13:
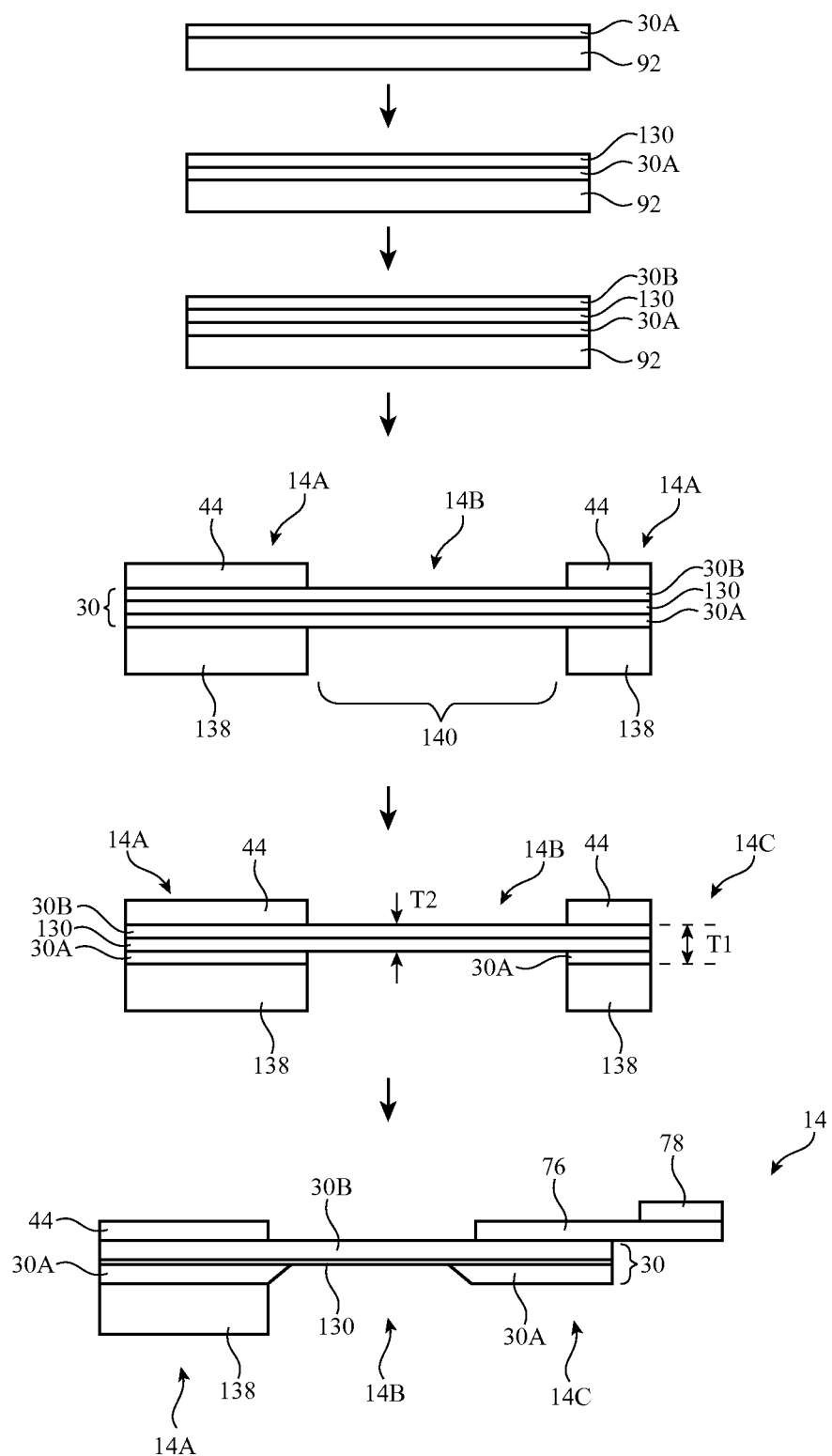
FIG. 13 is a diagram illustrating how a display with a bent region may be formed by locally thinning a flexible substrate using a back-side etch process in accordance with an embodiment.

In the illustrative arrangement of FIG. 13, a backside dry etch process has been used to locally thin substrate 30. Initially, polyimide layer 30A may be deposited on glass layer 92. Following deposition of polyimide layer 30A, an inorganic etch stop layer such as etch stop layer 130 may be deposited on layer 30A. Upper polyimide layer 30B may then be deposited on etch stop layer 130. Thin-film circuitry 44 may be formed on layer 30B and polymer layer 138 may be attached to the rear surface of layer 30. Polymer layer 138 may be, for example, a layer of polyethylene terephthalate and may have an opening such as opening 140 that exposes a portion of layer 30A. After forming patterned polymer layer 138, a dry backside etch (e.g., a low temperature atmospheric etch) may be used to remove the exposed portions of lower polyimide layer 30A. Etching stops at etch stop layer 130. At this point, substrate 30 has been selectively thinned so that portion 14B of substrate 30 has a thickness T2 that is less than thickness T1 of substrate 30 in regions 14A and 14C. After selective thinning of polyimide substrate 30, display processing may be completed (e.g., driver 78 may be added, neutral stress plane adjustment layer 84 may be added, unwanted portions of polymer layer 138 may be removed, etc.).

Figure 14:
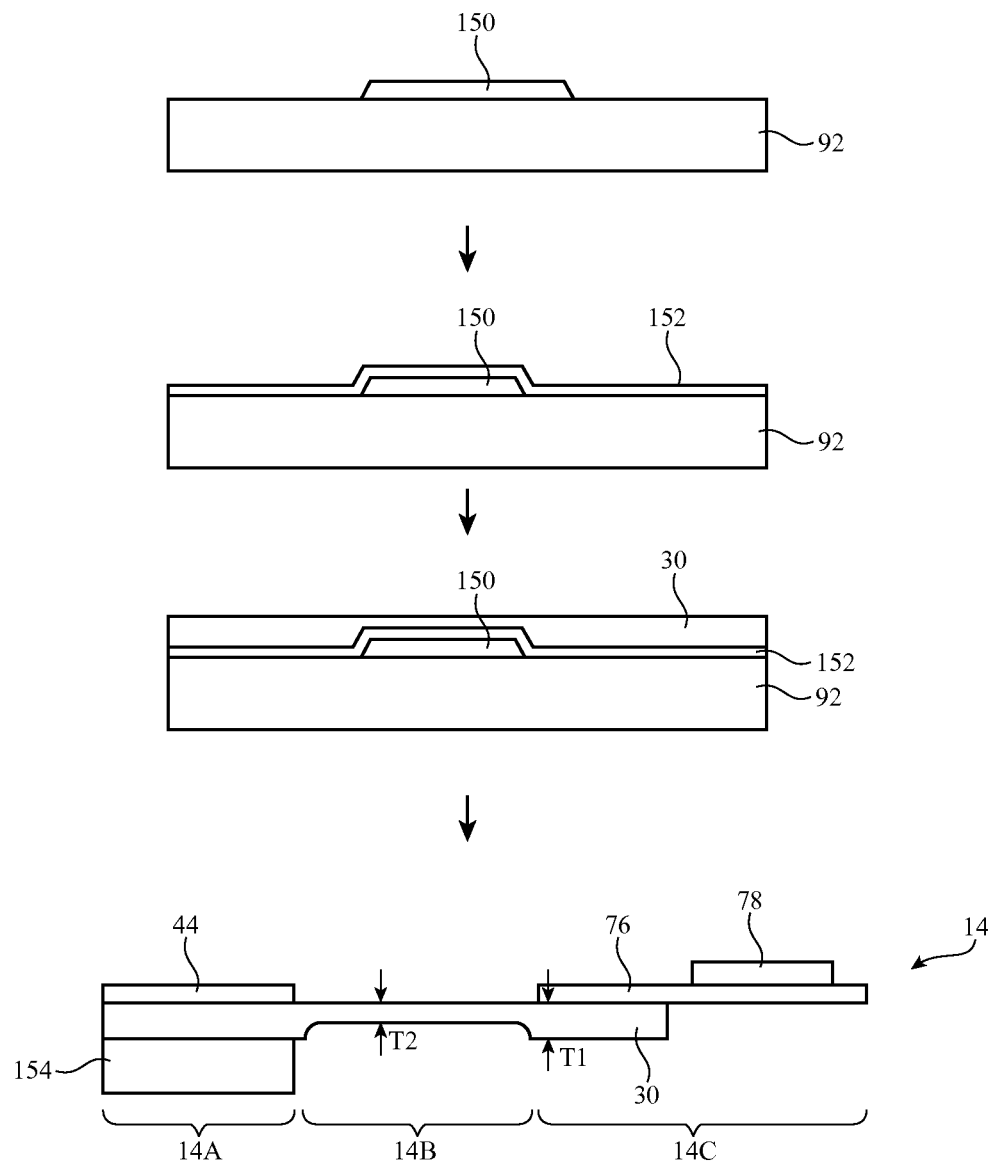
FIG. 14 is a diagram illustrating how a display with a bent region may be formed by depositing and curing a liquid polymer on a temporary substrate with raised portions in accordance with an embodiment.

Another illustrative technique for forming a display with a locally thinned polyimide substrate is illustrated in FIG. 14. As shown in FIG. 14, a thin layer of material such as a spin-on-glass layer may be deposited and patterned to form raised areas 150. Raised portions 150 may serve as a template (mold) for use in locally thinning subsequently deposited polyimide. Areas 150 may be photolithographically patterned from a deposited photosensitive layer of material or may be formed by etching bulk glass (e.g., portions of substrate 92).

After forming patterned raised portions 150 on substrate 92, a thin sacrificial layer such as a layer of amorphous silicon 152 may be deposited over the surface of substrate 92 and patterned template 150. Layer 152 may facilitate polyimide delamination. The thickness of layer 152 may be 500 angstroms to 5000 angstroms (as an example). After forming layer 152, a layer of liquid polyimide may be formed over the surface of substrate 92. The deposited liquid may be cured using thermal curing or ultraviolet light curing. Due to the presence of raised structure 150, polyimide layer 30 will be characterized by thicker portions of the thickness T1 and thinner portions of thickness T2.

After curing polyimide layer 30, a laser may be used to apply light to the lower surface of substrate 92. Substrate 92 and structures 150 are preferably transparent to the laser light. The laser light is therefore absorbed in amorphous silicon layer 152. This causes layer 152 to release hydrogen and thereby helps release polyimide layer 30 from substrate 92. Following the release of locally thinned polyimide layer 30, display processing may be completed. For example, polymer substrate layer 154 may be formed under thin-film transistor circuitry 44 in region 14A and display driver circuitry 78 may be attached to substrate 30 using flexible printed circuit 76 in region 14 C. Neutral stress plane adjustment layer 84 may be added to substrate 30 in region 14 B to ensure that display 14 is not damaged during bending.

In general, either the upper surface, the lower surface, or both the lower and upper surfaces of substrate 30 may be thinned. Moreover, the thinned portion of substrate 30 may overlap underlying support structures (e.g., layers 122 and 110) or may extend past the edges of these underlying support structures. FIGS. 15, 16, 17, 18, 19, and 20 are cross-sectional side views of display 14 with different illustrative thinned substrate configurations.

Figure 15:
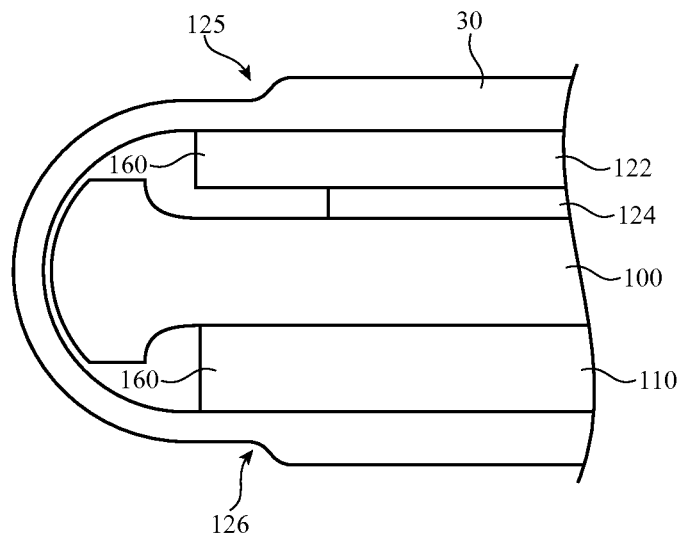
FIGS. 15, 16, 17, 18, 19, and 20 are cross-sectional side views of illustrative displays with different thinned substrate configurations in accordance with embodiments.
Figure 16:
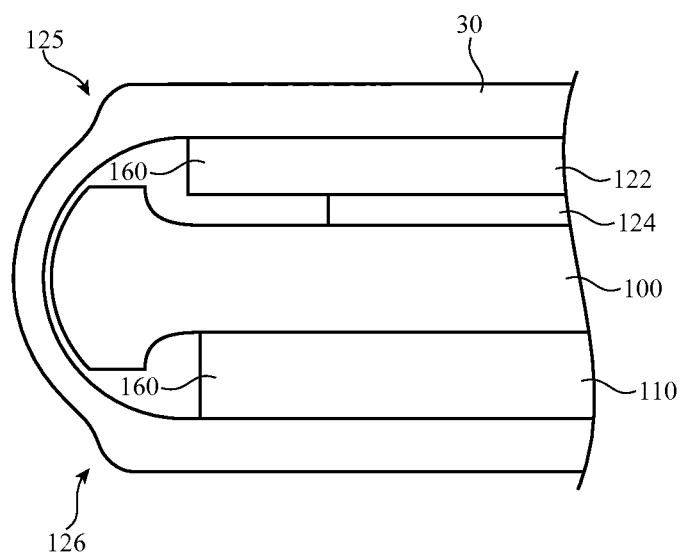

In the example of FIG. 15, substrate 30 has been thinned from the upper surface and steps 125 and 126 overlap support structures 122 and 110 respectively (i.e., edges 160 of layers 122 lie to the left of steps 125 and 126 in the orientation of FIG. 15). FIG. 16 shows how steps 125 and 126 may be formed so that these steps do not overlap layers 122 and 110 (to present layers 122 and 110 with a uniform overlapping substrate thickness).

Figure 17:
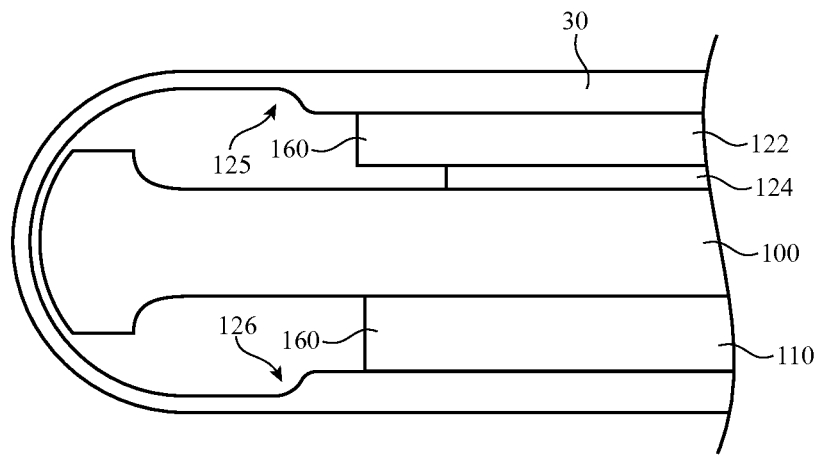
Figure 18:
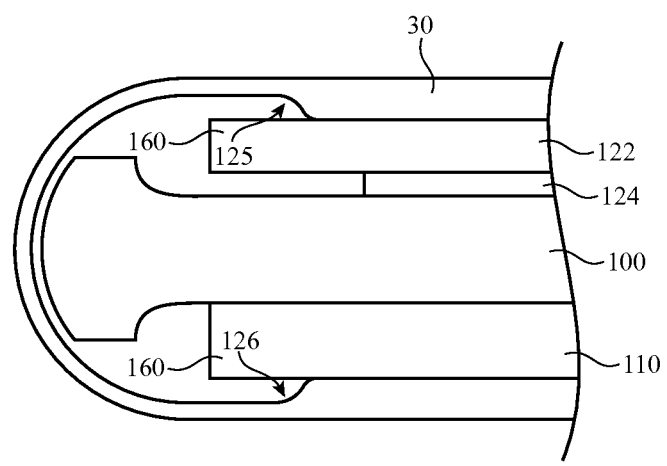

In the examples of FIGS. 17 (which shows a non-overlapping step arrangement) and 18 (which shows an overlapping step arrangement), layer 30 has been thinned from its lower surface.

Figure 19:
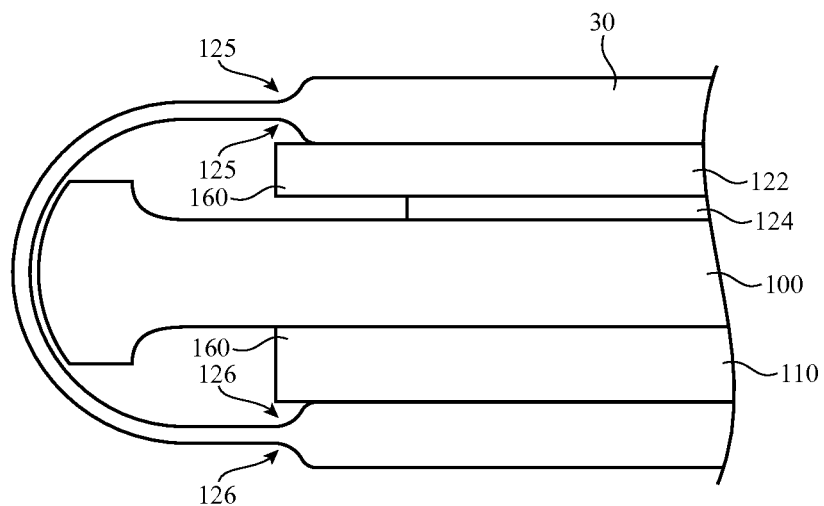
Figure 20:
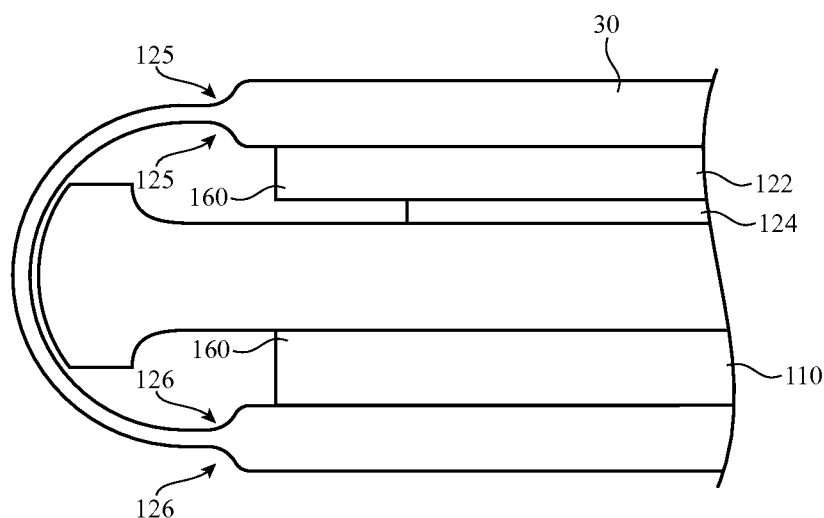

Both the upper and lower surfaces of substrate layer 30 have been thinned in the configurations of FIGS. 19 and 20. FIG. 19 shows an arrangement in which steps 125 and 126 overlap layers 122 and 110, respectively. FIG. 20 shows an arrangement in which steps 125 and 126 do not overlap layers 122 and 110.

The foregoing is merely illustrative and various modifications can be made by those skilled in the art without departing from the scope and spirit of the described embodi-

What is claimed is:

1. A display, comprising:
   a flexible substrate, wherein the flexible substrate comprises a flexible polymer substrate;
   an array of pixels that form an active area on the flexible substrate, wherein the array of pixels comprises an array of organic light-emitting diode pixels;
   metal traces that extend from the active area to an inactive area on the flexible substrate across a bend region on the flexible substrate, wherein the flexible substrate is locally thinned in the bend region; and
   a neutral stress plane adjustment layer on the flexible substrate in the bend region, wherein the neutral stress plane adjustment layer includes at least one polymer layer having portions that overlap the active area.

2. The display defined in claim 1 wherein the flexible substrate has a first thickness in the active area and has a second thickness that is less than the first thickness in the bend region and wherein the flexible substrate has the second thickness in the inactive area.

3. The display defined in claim 1 further comprising:
   a display driver integrated circuit;
   a flexible printed circuit to which the display driver integrated circuit is attached, wherein the flexible printed circuit is attached to the flexible polymer substrate in the inactive area.

4. The display defined in claim 1 wherein the metal traces are interposed between the neutral stress plane adjustment layer and the flexible substrate and wherein the array of organic light-emitting diode pixels comprises:
   a pixel definition layer having openings for the organic light-emitting diode pixels;
   thin-film transistors; and
   a planarization layer that covers the thin-film transistors and that is interposed between the pixel definition layer and the thin-film transistors.

5. The display defined in claim 4 wherein the planarization layer comprises a polymer layer that forms at least part of the neutral stress plane adjustment layer.

6. The display defined in claim 4 wherein:
   the pixel definition layer comprises a first polymer layer that forms at least part of the neutral stress plane adjustment layer; and
   the planarization layer comprises a second polymer layer that forms at least part of the neutral stress plane adjustment layer and wherein the neutral stress plane adjustment layer comprises a third polymer layer that covers the first and second polymer layers.

7. The display defined in claim 4 wherein the neutral stress plane adjustment layer comprises an encapsulation layer.

8. The display defined in claim 4 wherein the neutral stress plane adjustment layer comprises a polymer encapsulation layer that forms part of an encapsulation layer stack with at least one organic layer and at least one inorganic layer.

9. A display, comprising:
   a flexible substrate;
   an array of pixels that form an active area on the flexible substrate, wherein the array of organic light-emitting diode pixels comprises:
      a pixel definition layer having openings for the organic light-emitting diode pixels;
      thin-film transistors; and
      a planarization layer that covers the thin-film transistors and that is interposed between the pixel definition layer and the thin-film transistors;
   metal traces that extend from the active area to an inactive area on the flexible substrate across a bend region on the flexible substrate; and
   a neutral stress plane adjustment layer on the flexible substrate in the bend region that aligns a neutral stress plane with the metal traces in the bend region, wherein the metal traces are interposed between the neutral stress plane adjustment layer and the flexible substrate and wherein the neutral stress plane adjustment layer includes at least one polymer layer having portions that overlap the active area.

10. The display defined in claim 9 wherein:
    the polymer layer is one of: the pixel definition layer, the planarization layer, an encapsulation layer, and a polymer cover layer;
    the flexible substrate comprises a flexible polymer substrate having a locally thinned portion in the bend region;
    the flexible substrate has a first thickness in the active area and has a second thickness that is less than the first thickness in the bend region; and
    the flexible substrate has the second thickness in the inactive area.

11. The display defined in claim 9 wherein the array of pixels comprises an array of organic light-emitting diode pixels.

12. The display defined in claim 9 wherein:
    the pixel definition layer comprises a first polymer layer that forms at least part of the neutral stress plane adjustment layer; and
    the planarization layer comprises a second polymer layer that forms at least part of the neutral stress plane adjustment layer.

13. The display defined in claim 12 wherein the neutral stress plane adjustment layer comprises a third polymer layer that covers the first and second polymer layers.

* * * * *